United States Patent [19]

Koike

[11] Patent Number: 5,450,353

[45] Date of Patent: Sep. 12, 1995

[54] STATIC RANDOM ACCESS MEMORY DEVICE HAVING RESET CONTROLLER

[75] Inventor: Tsuneo Koike, Tokyo, Japan

[73] Assignee: NEC Corporation, Tokyo, Japan

[21] Appl. No.: 284,194

[22] Filed: Aug. 2, 1994

[30] Foreign Application Priority Data

Aug. 2, 1993 [JP] Japan ................................. 5-191044

[51] Int. Cl.$^6$ ............................................. G11C 7/00
[52] U.S. Cl. ..................... 365/154; 365/195; 365/230.03; 365/218; 365/190
[58] Field of Search ................. 365/154, 195, 230.03, 365/189.01, 218, 190

[56] References Cited

U.S. PATENT DOCUMENTS

| | | | |
|---|---|---|---|
| 4,858,182 | 8/1989 | Pang et al. | 365/156 |
| 4,890,263 | 12/1989 | Little | 365/218 |
| 5,267,210 | 11/1993 | McClure et al. | 365/218 |

Primary Examiner—David C. Nelms
Assistant Examiner—Andrew Q. Tran
Attorney, Agent, or Firm—Whitham, Curtis, Whitham & McGinn

[57] ABSTRACT

A static random access memory device is equipped with a reset controller capable of performing a reset operation at high speed and with a reduced circuit configuration. The device has a memory cell including first and second data holding nodes and selectively connected to an associated bit line. The memory cell is equipped with a logic device for supplying a first voltage in common to the first and second holding nodes and, in response to a reset mode signal, supplying the first voltage to the first holding node and a second voltage being different from the first voltage to the second holding node. In this reset operation, a word decoder and word driver circuit is deactivated and inhibited from selecting and driving any word line.

10 Claims, 8 Drawing Sheets

STATIC RANDOM ACCESS MEMORY DEVICE HAVING RESET CONTROLLER

BACKGROUND OF THE INVENTION

The present invention relates to a static type random access memory device (SRAM), more particularly to a SRAM having a reset controller for resetting stored data at a high speed.

A conventional memory cell of a static type memory device has a pair of cross coupled transistors, that is, a gate electrode of each transistor being connected to a drain electrode of the other. The gate electrodes are connected to bit lines via transfer gate transistors, respectively. One of the bit lines is used for read access operation and the other is for write access or reset operation, as described below.

A functional block diagram of a static random access memory device is shown in FIG. 6 which has a one mega bits capacity with a bit construction such as 1 mega words × 1 bit. Memory cells 30 in a cell array are arranged in 1024 rows and 1024 columns, for example. Each of memory cells 30 is placed at a cross section of a word line W1, W2 or Wn and a bit line B0, B1 or Bm, as shown in FIG. 6, wherein only one of each pair of bit lines is shown for simplicity.

In read mode operation, address signals A10–A19 are input to a word decoder 42 through an address bus 41. The decoder 42 decodes the address signals and therefore drives selected one of the word lines Wn to be its active level. Each memory cell 30 corresponding to the word line Wn is connected and outputs its holding data to a respective pair of bit lines. A column selector, which is supplied with address signals A0–A9 via an address bus 41, selects one of the pairs of bit lines and connects it to an input and output terminal 43.

In write mode operation, the decoder 42 decodes the address signals A10–A19 and drives selected one of the word lines Wn. Each memory cell 30 corresponding to the word line Wn is connected to the respective pair of bit lines. The column selector supplied with the address signals A0–A9 selects and drives one of the pairs of bit lines according to an input data from the input and output terminal 43.

A typical circuit configuration of the memory cell 30 so called four transistor type is shown in FIG. 7. Transistors 1 through 4 are of N channel type with back gate electrodes connected to a grounding voltage GND. Drain electrodes of the transistors 1 and 2 are connected to a power supply voltage VDD via load resistances 5 and 6 respectively. Source electrodes of the transistors 1 and 2 are commonly connected to the grounding voltage. Gate electrodes of the transistors 1 and 2 are connected to the drain electrodes of the transistors 2 and 1, respectively. The drain electrodes of the transistors 1 and 2 are also connected to source electrodes of transfer gate transistors 3 and 4 respectively. The gate electrodes of the transfer gate transistors 3 and 4 are commonly connected to a word line Wn. The drain electrodes of the transistors 3 and 4 are connected to bit lines Bm and *Bm respectively. In this case, those two signals one of which is labeled with an asterisk and another of which is not form a complementary pair of signals.

In detail, although only one of the bit lines is shown for each memory cell in FIG. 6, one of the bit lines Bm and *Bm is used for transferring read data and another is used for transferring write data or reset data signal. For example, the bit line *Bm transfers a write data to the memory cell 30 and the bit line Bm transfers a read data from the memory cell. That is, in a write mode operation wherein a data "0" is to be written in the memory cell 30, the bit line *Bm is maintained at a low level by the column selector 43 when the word line Wn in driven to the active level. The transistor 3, with its gate electrode being driven by the word line Wn, turns conductive to transfer the low level of the bit line *Bm to the drain electrode of the transistor 1 and the gate electrode of the transistor 2. The transistor 2 turns nonconductive to raise its drain voltage to the power supply voltage VDD. Then, the transistor 1 turns conductive to maintain the low voltage at the drain electrode thereof. Therefore, even after the word line Wn turns back to its nonactive level, the drain voltage of the transistor 1, which represents a stored data, is maintained stably. In case where a data "1" is to be written in the memory cell 30, the write operation is performed in nearly the same and well known manner. In a read mode operation, after the word line Wn is driven to the active level and the stored data in the memory cell 30 is transferred to the bit lines Bm and *Bm, the column selector 43 selects the bit line Bm and connects it to the input and output terminal 44. The read data signal from the bit line Bm is transferred via the terminal 43 to a read data amplifier (not shown).

In case where a static random access memory device is to be initialized, that is, when the memory cells are to be reset to hold a certain data uniformly, the write operation for writing the certain reset data in the memory cells have to be performed repeatedly. For example, as for a SRAM device of which a write cycle time is 15 ns and a bit construction is 1 mega words × 1 bit, the reset operation to reset all the memory cells 30 requires a period such as $15 \times 10^{-9} s \times 2^{20} = 15728640 \times 10^{-9} s \approx 16$ ms. When the SRAM is connected via a data bus to a microprocessor, the SRAM is initialized in the control of the microprocessor and programs executed therein, causing a long time for reset operation.

A typical example of such a initialization procedure for resetting memory data of a SRAM with a microprocessor is shown in FIG. 8. At first, in a step S1, a base address of the SRAM which is used by the microprocessor for accessing it is set up. A loop counter for control the loop cycles of the procedure is also set up in a step 2. For example, when the initialization is to be performed on all the memory cells, the loop counter is set at $2^{20}$. After that, in a step 3, the write operation is performed to write a initial data, for example "0", in a memory cell indicated by the base address. Then the address is increased in a step S4 and the loop counter is decreased in a step S5. In a step S6, a value of the loop counter is checked and, if the value is "0", the initialization procedure is over. If the value is still larger than "0", the microprocessor gets back to the step S3 and continues to perform the write operation to write the initial data. On the condition that the microprocessor requires, for example, 40 ns for executing each instruction which corresponds each of the steps S1 to S6, the microprocessor requires for performing the initialization procedure a period such as:

$$\{1+1+(1+1+1) \times 2^{20}\} \text{ (steps)} \times 40 \times 10^{-9} \text{ (seconds)} \approx 126 \text{ ms.}$$

The initial data to be written in the memory cells in the reset operation is common to all the memory cells as mentioned above. However, the reset data is capable of being set for each of the memory cells by programs for the microprocessor. In such a case, the microprocessor generates the reset data patterns according to a increment of the address of the SRAM and writes the respective reset data in a memory cell in each of the write steps S3. For example, in case where the SRAM is used as a cache memory of the microprocessor, the address of the SRAM is used as a cache line address and linked with cache data which represents respective I/O data to be stored in the cache memory, a cache tag which holds an address of the cache data in a main memory, and a cache valid bit which represents whether the cache data is valid or not. In order to perform the initialization operation on such a cache memory, all the valid bits are to be reset to be "0". In addition, a cache system usually performs a certain operation so called cache invalidate operation in which the cache bits are set to be "0" independently from the initialization operation as mentioned above.

Therefore, in the conventional memory device, since the initialization operation is performed by write operation transferring reset data via a data bus to the memory cell, the initialization operation requires a long time period to be performed. In particular, in a SRAM used as a cache memory, the initialization operation or the invalidate operation is required to be performed in a very short time so as to reduce the waiting time of the microprocessor. However, in the conventional device, the initialization operation, which takes about 126 ms as mentioned above, prevent a operation of the microprocessor and decrease total operation speed of the whole data processing system.

There has been proposed an certain type of SRAM device which is capable of performing the reset operations on a plurality of memory cells at a same time. A block diagram of such a device is shown in FIG. 9. The device shown in FIG. 9 is equipped with OR gates each having an output terminal coupled to each of the word lines Wn and one input terminal coupled to the word decoder 42. Another input terminals of each of the OR gates are connected commonly to a inverter 45 for transferring a initialization control signal *INIT when a initialization operation mode. The bit lines Bm, which is used for transferring write or reset data signals, is coupled to the grounding line GND via transfer gate transistors 47 having gate electrode connected to the output of the inverter 45. During the initialization operation mode, the control signal *INIT turns to its active low level. Therefore the inverter 45 supplies a high level signal to all the OR gates, which drive all the word lines Wn to the active high level. At the same time, the bit lines Bm turn to the grounding level. Therefore, all the memory cells in the device is reset at the same time. However, in this device, since the logical OR gates 46 are coupled between the word decoder 42 and the word lines Wn, a operation speed in a usual read or write operation wherein the control signal *INIT is at a high level is decreased by a transfer delay time of those logical OR gates 46. The delay time caused by the gates 46 is, for example, about 3 ns, increasing the total access time in such usual operations from the 15 ns as mentioned above to 18 ns. Moreover, in this device, the reset data are set only for each bit line, that is, the reset data cannot be set for each memory cell independently.

SUMMARY OF THE INVENTION

Therefore, an object of the present invention is to provide a static type memory device capable of resetting stored data at a high speed.

Another object of the invention is to provide a static memory device capable of resetting data in a particular group of memory cells at a same time.

Further object of the invention is to provide a memory device capable of performing reset operation on particular groups of memory cells independently to each other.

The device according to the present invention is equipped with reset controll circuits capable of performing a reset operation at high speed and with a reduced circuit configuration. The device has a memory cell including first and second data holding nodes and selectively connected to an associated bit line. The memory cell is equipped with a control gate for supplying a first voltage in common to said first and second holding nodes and, in responce to a reset mode signal, supplying the first voltage to the first holding node and a second voltage being different from the first voltage to the second holding node. In this reset operation, a word decoder and word driver circuit is deactivated and inhibited from selecting and driving any word line.

BRIEF DESCRIPTION OF THE DRAWINGS

The above mentioned and other objects, advantages and features of the present invention will become more apparent from the following detailed description taken in conjunction with the accompanying drawings, in which.

DETAILED DESCRIPTION OF PREFERRED EMBODIMENTS

Figure 1:
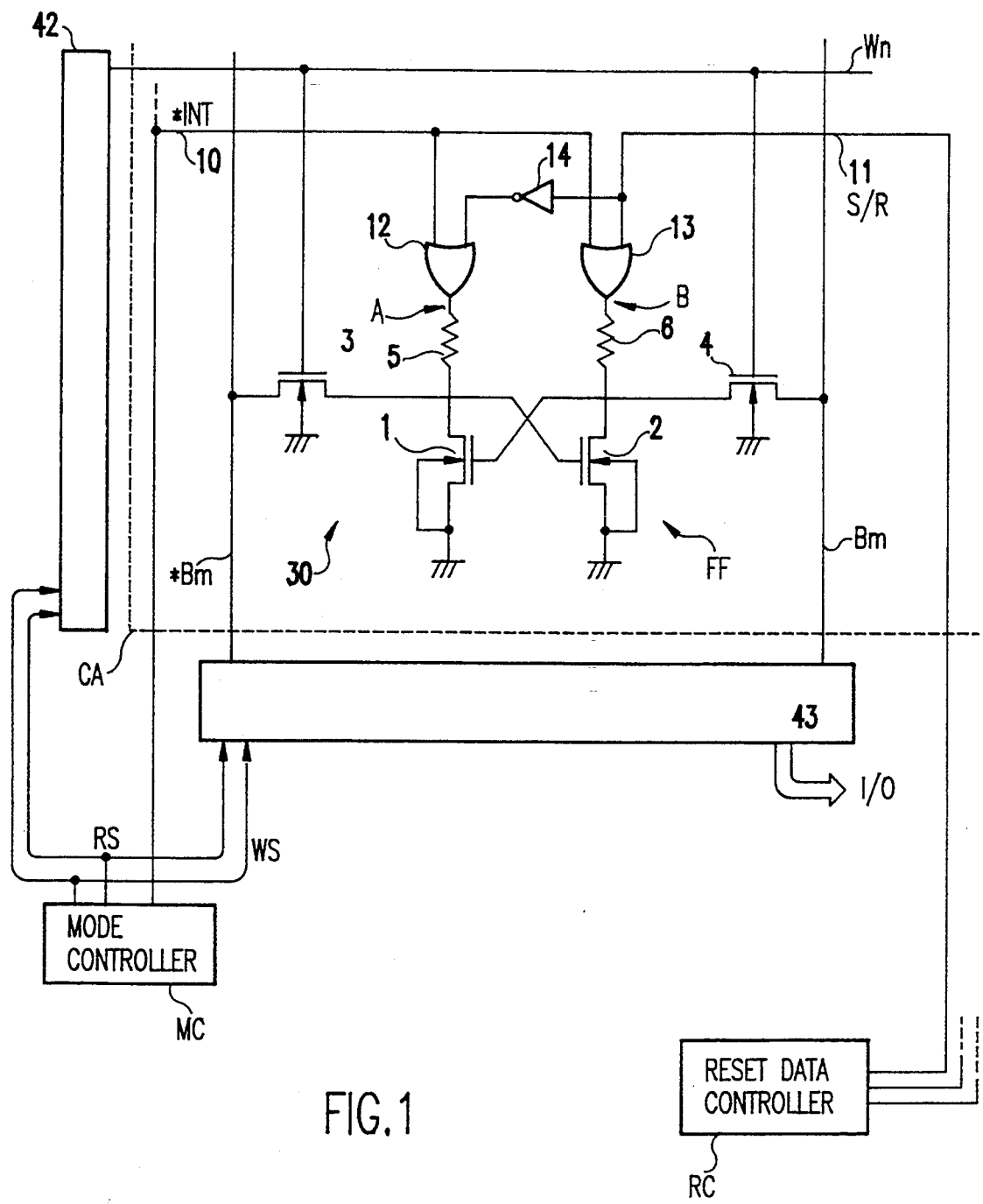
FIG. 1 is a circuit configuration of a memory cell of a memory device of first embodiment of the present invention.
Figure 7:
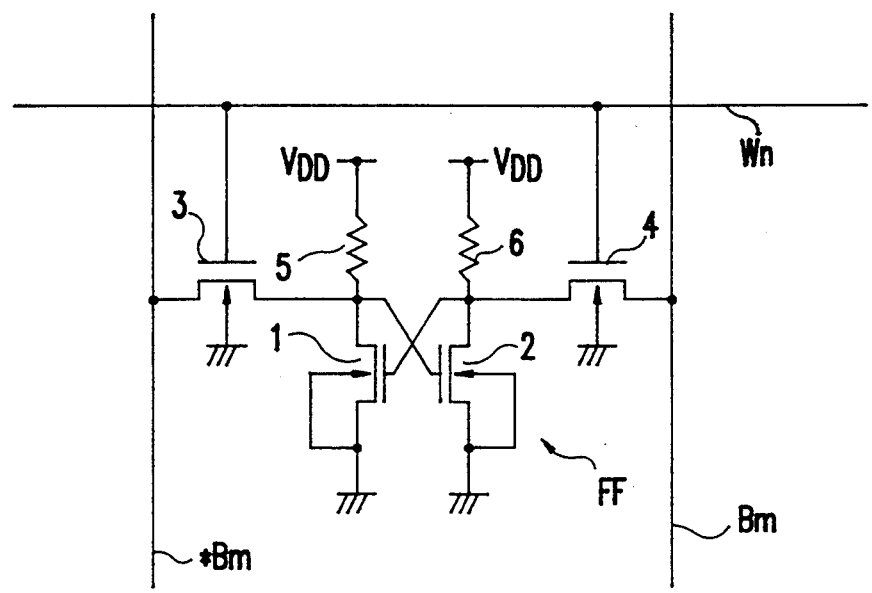
FIG. 7 is a circuit configuration of a conventional memory cell in a static type memory device.
Figure 8:
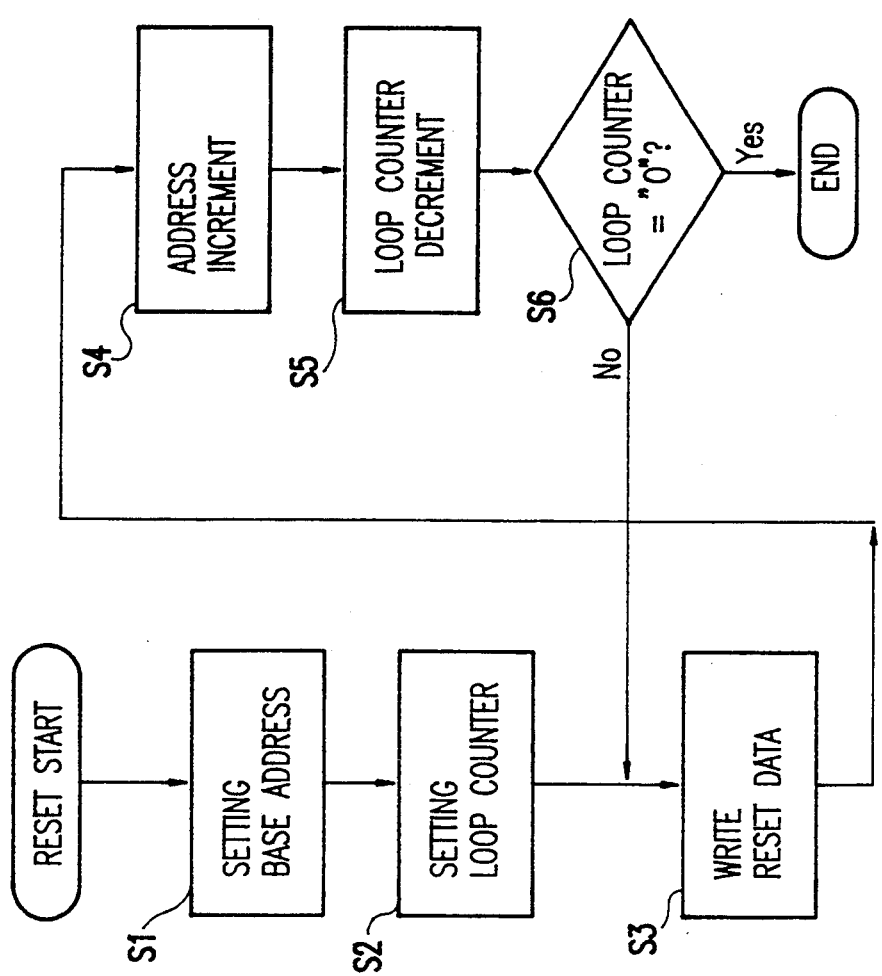
FIG. 8 is a flow chart showing steps of a initialization operation in a conventional SRAM device.
Figure 9:
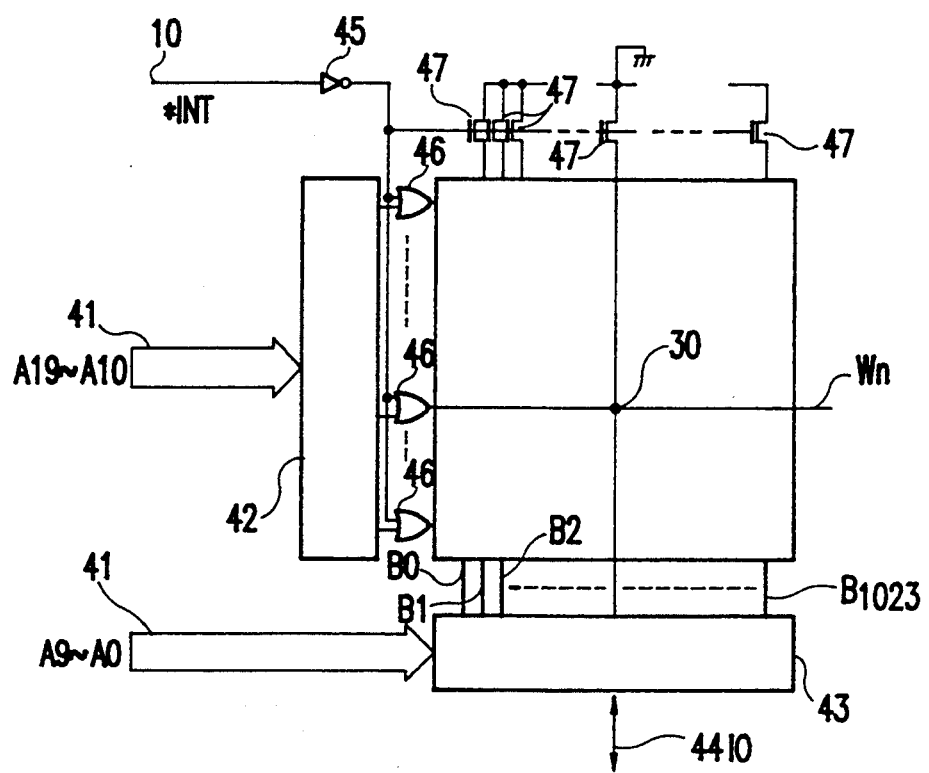
FIG. 9 is a block diagram of another conventional memory device.

In a memory device according to a embodiment of the present invention as shown in FIG. 1, a memory cell array CA has memory cells 30. In each of the memory cells, the cross connected transistors 1 and 2 and load resistances 5 and 6 form a flip-flop circuit FF in the same manner as the circuit shown in FIG. 7. The flip-flop circuit is connected to bit lines Bm and *Bm via transfer gate transistors 3 and 4. The gate electrodes of the transfer gate transistors 3 and 4 are connected to the word line Wn. The opposite ends of the load resistances 5 and 6, which are connected to the power supply line in the circuit shown in FIG. 7, are in this case connected to output terminals of logical OR gates 12 and 13, respectively. An input terminal of each of the OR gates is connected to a control signal line 10 for transferring the control signal *INT from a operation mode controller MC. Another input terminal of the OR gate 13 is connected to a reset signal line 11 for transferring a reset signal S/R from a reset data controller RC which takes a logical value "1" when a data "1" is to be written in the memory cell in a reset operation. Another input terminal of the OR gate 12 is connected to an output electrode of an inverter 14 which is supplied with the reset signal S/R.

In this device, the mode controller MC outputs read and write mode signals RS and WS to a word decoder and word driver circuit 42 and to a column selection circuit 43. During the reset mode operation, the mode controller MC deactivates the read and write mode signals RS and WS. Therefore the word decoder and driver circuit 42 is also deactivated and inhibited from selecting any word lines Wn, maintaining the transfer gate transistors 3 and 4 in each of the memory cells 30 being nonconductive. The column selection circuit 43 also selects no bit line. That is, the read or write mode signal RS or WS and the reset control signal *INT are supplied from the mode controller alternately. Therefore during the reset operation, each of the memory cells is electrically disconnected from the bit lines Bm.

The operation of the memory cell shown in FIG. 1 will be explained with reference to Table 1 shown below.

TABLE 1

| *INT | S/R | A | B |
|------|-----|-----|-----|
| VDD | VDD | VDD | VDD |
| VDD | GND | VDD | VDD |
| GND | VDD | GND | VDD |
| GND | GND | VDD | GND |

When the control signal *INT is at VDD level, the output voltages at the nodes A and B of the OR gates 12 and 13 turns to the VDD level irrespective of the reset signal S/R. This condition is the same as the flip-flop circuit in the memory cell is supplied with a power voltage VDD as in a same manner as shown in FIG. 7. That is, the nodes A and B are function as power terminals of the flip-flop circuit FF. In this state, the memory cell stores its holding data stably. When the control signal *INT is at grounding level GND and the reset signal S/R is also at grounding level GND, the output levels A and B of the OR gates 12 and 13 turns to grounding level GND and power supply level VDD, respectively. When the control signal *INT is at grounding level GND and the reset signal S/R is at power supply level VDD, the output levels A and B of the OR gates 12 and 13 turns to power supply level VDD and grounding level GND, respectively.

That is, during the usual read or write operations, the control signal *INT is maintained at its high level, that is power supply level VDD, so that the memory cell shown in FIG. 1 functions as a flip-flop type memory cell and accessed via transfer transistor 3 or 4, in read or write operation, respectively. During the reset operation, the control signal *INT turns to low level GND so that the memory cell is reset by the reset signal S/R and according to Table 1.

More in detail, when the control signal *INT and the reset signal S/R turn to grounding level GND, at first, the output voltage B turns to grounding voltage GND so that the transistor 1 turns nonconductive. The drain voltage of the transistor 1 is raised by the output; voltage A, which is at power supply voltage VDD, via the load resistance 5. Then the transistor 2 turns conductive and maintains its drain electrode and the gate electrode of the transistor 1 at grounding voltage. Therefore, after the control signal *INT turns back to power supply level VDD, the voltage distribution condition in the flip-flop circuit, that is, the drain voltages of the transistors 1 and 2 at power supply level VDD and grounding level GND respectively, is maintained. That is, the reset data is stored in the memory cell stably. The other operation when the control signal *INT and the reset signal S/R turn to grounding level GND and power supply level VDD respectively is performed in nearly the same manner.

Figure 6:
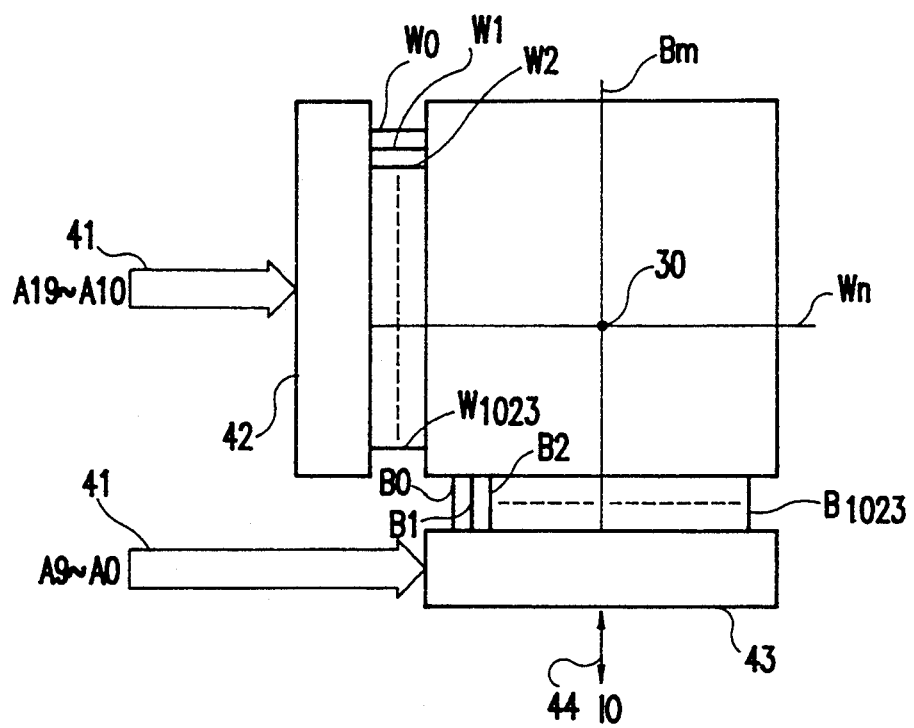
FIG. 6 is a block diagram of a conventional memory device.

In this device, the total operation time of the reset operation is defined by the transferring delay time in the logical OR gate 12 or 13 and the inverting delay time which is necessitated for the flip-flop circuit to invert its voltage distribution condition according to the input reset signal S/R. The inverting delay time in the flip-flop circuit is about two times large as the switching delay time of the transistor 1 or 2. For example, on a condition that the delay time in the OR gate 12 or 13 is about 3 ns and the switching delay time of the transistor 1 or 2 is about 2 ns, the total reset operation time is about $3+2\times2=7$ ns. This operation time is highly smaller than that of the conventional device shown in FIG. 6 because the device of this embodiment does not necessitates decoding operation in the word decoder, which is performed by a logical gates such as NAND gates having a number of transistors, nor the word line activation operation to render the transfer gate transistors 3 and 4 conductive.

Figure 2:
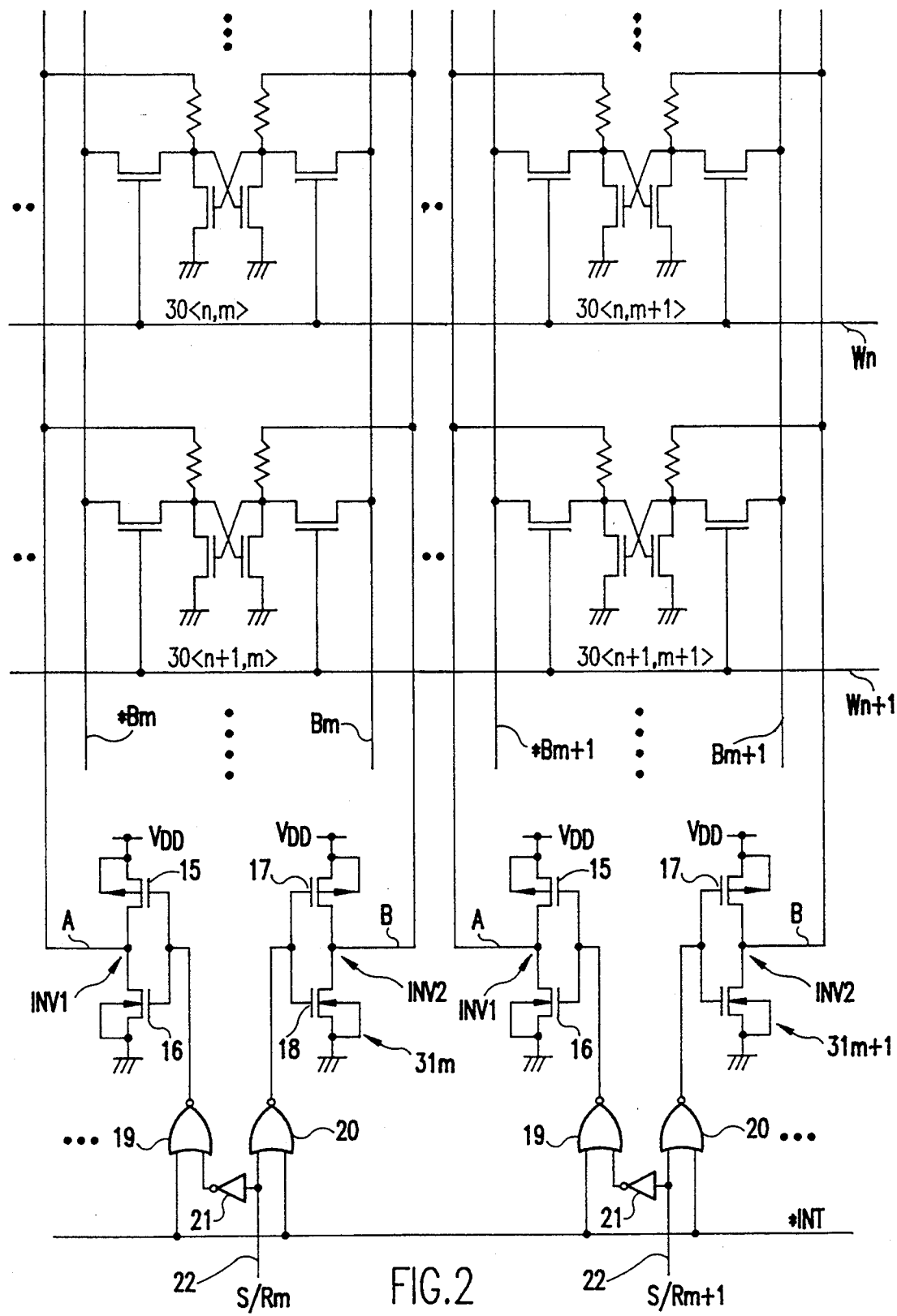
FIG. 2 is a circuit configuration of a device of second embodiment of the invention.

In a memory device according to the second embodiment of the invention as shown in FIG. 2, the reset data can be defined for each of columns of the memory cells. That is, the memory cells corresponding to a common bit line are reset by a common reset signal and memory cells corresponding to different bit lines are reset according to respective reset signals independently from each other. Each memory cell 30 has a same circuit configuration as shown in FIG. 1. The memory cell 30 corresponding to a word line Wn and bit line Bm is labeled with a signal $<n,m>$ such as $30<n,m>$ in FIG. 2.

In this circuit configuration, the opposite ends of each of the load resistances 5 in each of memory cells 30 corresponding to bit line Bm, that is, the memory cells $<0,m>$, $<1,m>$, . . . , $<n,m>$, $<n+1,m>$, . . . , $<1023,m>$, are commonly connected to an output node of an inverter INV1 in a reset controller 31m. The opposite ends of the resistances 6 are also connected in common to an output node of an inverter INV2 in the reset controller 31m. A circuit configuration according to the other bit lines Bm+1 are also in nearly the same manner. The input nodes of the inverter INV1 and INV2 are connected to an output nodes of logical NOR gates 19 20, respectively. An input node of each of the logical NOR gates 19 and 20 is commonly connected to the control signal line 10 for transferring the reset signal *INT. Another input node of the NOR gate 20 is connected to a signal line 22 for transferring the reset signal S/Rm. Another input signal of the NOR gate 19 is connected to an output node of an inverter 21 which is supplied with the reset signal S/Rm. The inverter INV1 and INV2 are designed to have enough large capabilities for driving and supplying currents to all the memory cells corresponding thereto. As shown in FIG. 2, when the control signal *INT turns to low level, the initialization, or reset, mode operation begins wherein the memory cells 30<n,m> corresponding to a con, non column or bit line are supplied with a common reset signal and store the reset signal.

An example of a distribution of the reset data stored in each memory cells 30 in a SRAM, according to the second embodiment, of which a bit construction is 1 mega word×1 bit is shown in Table 2.

TABLE 2

| address A19 - A 0 | reset signal |
| --- | --- |
| 00000 H | S/R0 |
| 00001 H | S/R1 |
| 00002 H | S/R2 |
| ... | ... |
| 003FF H | S/R1023 |
| 00400 H | S/R0 |
| 00401 H | S/R1 |
| ... | ... |
| FFFFE H | S/R1022 |
| FFFFF H | S/R1023 |

As shown in Table 2, reset signals S/R1, etc. corresponding to the address signals 00000 H, etc. are repeated cyclicly for each 1024 addresses. This correspondence between the addresses and reset data of the memory cells is achieved by the circuit configuration of FIG. 2 wherein the memory cells on a common column are reset according to a common reset data.

Figure 3:
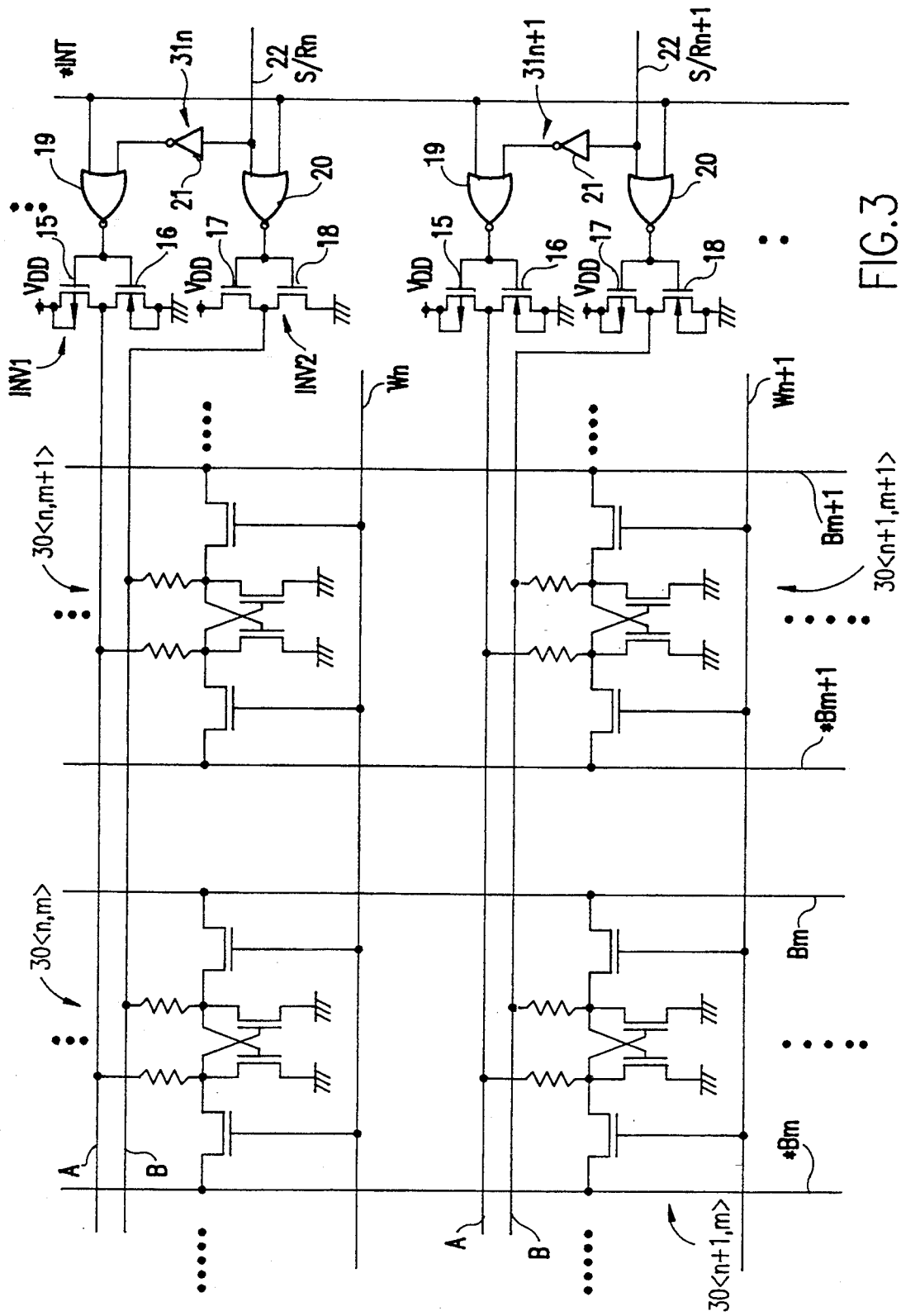
FIG. 3 is a circuit configuration of a device of third embodiment of the invention.

FIG. 3 shows a circuit diagram of a memory device according to third embodiment of the invention. In this circuit, the memory cells 30 arranged along to a row of the cell array form a block on which the reset operation is to be performed according to a common reset signal S/Ri. Each memory cell 30 has the same configuration as the memory cells shown in FIG. 1 or 2. The reset controller 31n is also has the same configuration as the reset controller 31m of FIG. 2. In this embodiment, the memory cells 30 corresponding to a common word line Wn, that is, the memory cells 30<n,m>, <n,m+1>, are supplied with a common reset signal S/Rn from the inverter INV1 and INV 2 in the reset controller 31n.

An example of a distribution of the reset data stored in each memory cells 30 in a SRAM, according to the third embodiment, of which a bit construction is 1 mega word×1 bit is shown in Table 3.

TABLE 3

| address A19 - A 0 | reset signal |
| --- | --- |
| 00000 H | S/R0 |
| 00001 H | S/R0 |
| 00002 H | S/R0 |
| ... | ... |
| 003FF H | S/R0 |
| 00400 H | S/R1 |
| 00401 H | S/R1 |
| ... | ... |
| FFFFE H | S/R1023 |
| FFFFF H | S/R1023 |

As shown in Table 3, each of reset signals S/R1, etc. corresponds commonly to each continuous 1024 addresses 00000 H–003FF H, etc. This correspondence pattern between the addresses and reset data of the memory cells is achieved by the circuit configuration of FIG. 3 wherein the memory cells on a common row are reset according to a common reset data.

Next, the fourth embodiment of the invention will be explained below. In this embodiment, the memory cells 30 form certain blocks in both of row and column direction as unit of the reset operation. That is, in this circuit, the memory cells arranged in 1024 rows and 1024 columns are re-arranged to form a 16 blocks 401 arranged in 4 rows and 4 columns and each having 256×256 memory cells. The blocks 401 are labeled with signs such as <i,j> in FIG. 4. In a block 401<i,j>, the load resistances 5 in each of memory cells 30 are commonly connected to a respective reset controller 31<i,j>. The load resistances 6 are also connected to the reset controller 31<i,j>. Each reset controller is supplied with a control signal *INT and reset signal S/R<i,j>. When the control signal *INT turns to the low level, the 256×256 memory cells in each of the 16 blocks 401<i,j> are reset according to the respective one of 16 reset signals S/R<i,j>.

Table 4 shows an example of data distribution in a SRAM device according to the fourth embodiment.

TABLE 4

| address A19 - A 0 | reset signal |
| --- | --- |
| 00000 H | S/R<0,0> |
| 00001 H | S/R<0,0> |
| 00002 H | S/R<0,0> |
| 000FF H | S/R<0,0> |
| 00100 H | S/R<0,1> |
| 001FF H | S/R<0,1> |
| 00200 H | S/R<0,2> |
| ... | ... |
| 3FFFF H | S/R<0,3> |
| 40000 H | S/R<1,0> |
| ... | ... |
| 400FF H | S/R<1,0> |
| 40100 H | S/R<1,1> |
| ... | ... |
| 7FFFF H | S/R<1,3> |
| 80000 H | S/R<2,0> |
| ... | ... |
| BFFFF H | S/R<2,3> |
| C0000 H | S/R<3,0> |
| ... | ... |
| FFFFF H | S/R<3,3> |

Figure 5:
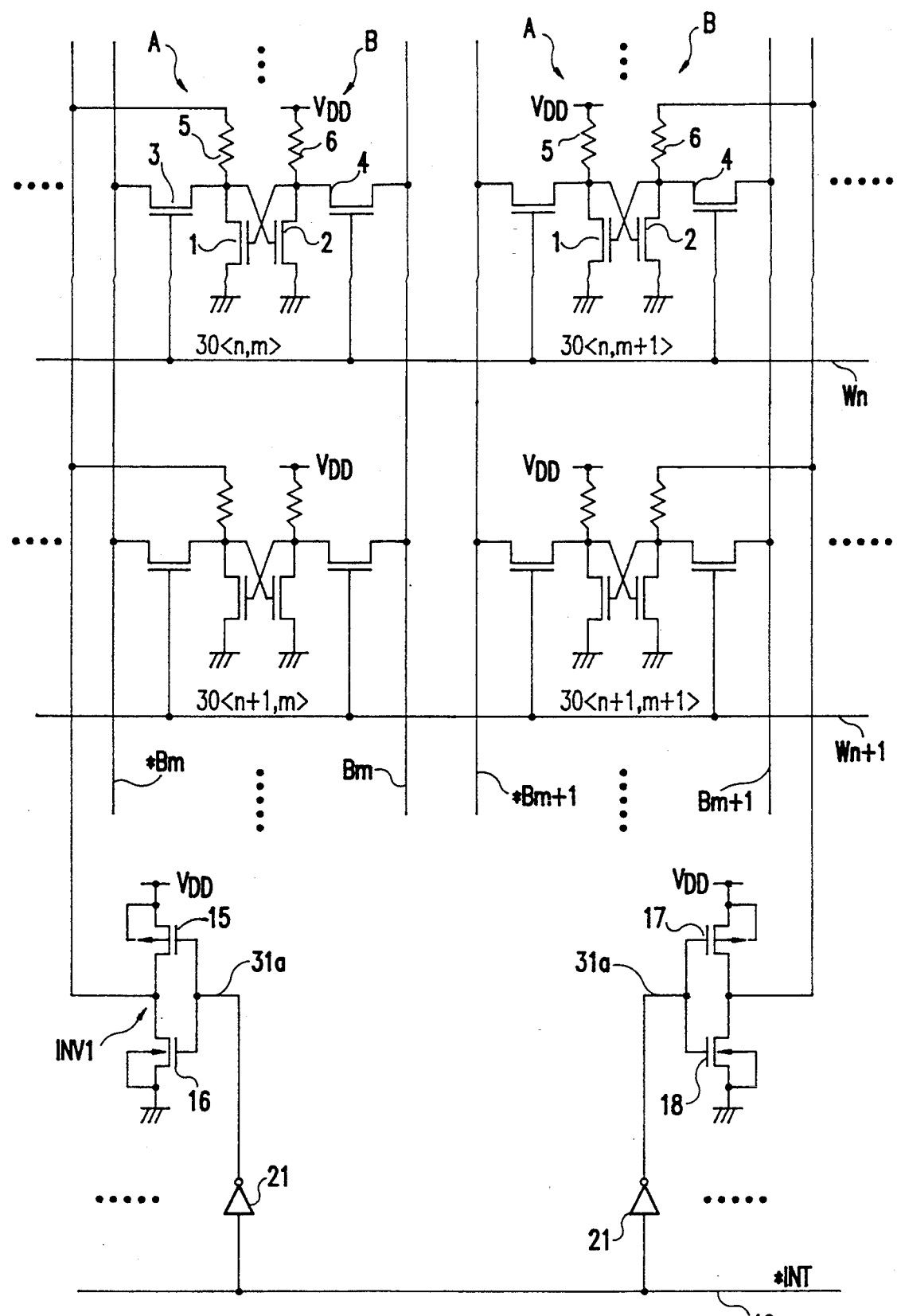
FIG. 5 is a circuit configuration of a device of fifth embodiment of the invention.

FIG. 5 shows a circuit diagram of a memory device according to fifth embodiment of the invention. In this circuit, the reset signal S/R and circuit portions necessitated to transfer the signal S/R in the second embodiment is eliminated and, therefor, a load resistance 5 or 6 in each of the memory cells 30<n,m> are connected to a power voltage line VDD. As for the memory cell 30<n,m>, the opposite end B of the load resistance 6 is connected to the power supply line VDD and the opposite end A of the load resistance 5 is connected to a reset controller 31a having inverter INV1 and 21. The inverter 21 is supplied with a control signal *INT. When the control signal *INT turns to low level, that is, in the reset operation, the node A of the load resistance 5 turns to grounding level GND. Therefore the transistor 2 turns nonconductive, having its drain voltage being raised by the load resistance 6 which is connected to the power supply level VDD, The transistor 1 turns conductive and maintain the gate electrode of the transistor 2 at the grounding level. Therefore, after the control signal *INT turns back to the power supply level VDD, the transistors 1 and 2 and the load resistances 5 and 6, which form a flip-flop circuit, maintains the reset data. That is, the reset data is stored in the memory cell 30<n,m> as being represented by a voltage distribution such that the drain voltages of the transistors 1 and 2 are low and high respectively. As shown in FIG. 5, the memory cells $30<n+1, m>$, $30<n+2,m>$, etc. are reset in the same manner as the memory cell $30<n,m>$. On the contrary, as shown in FIG. 5, the memory cells $30<n,m+1>$, $30<n+1,m+1>$, etc., in which the load transistors 6 are connected to the power supply voltage VDD, are reset to have a data represented in such a manner that the drain voltages of the transistors 1 and 2 are high and low respectively. As apparent from the above explanation, the reset data can be defined for each of memory cells $30<i,j>$. This circuit configuration is capable of eliminate the reset signal and reduce circuit portions for transferring it. In particular, this configuration can effectively reduce the wiring density along the row direction. Although this memory device according to the fifth embodiment has no particular means for resetting each memory cells in the control of microprocessor or programs executed in it, this circuit is applicable for those devices which does not necessitates reset operations to input a random reset value to each memory cells in each reset operation. For example, as for the invalidate operation in the cache system for reset the cache valid bits to an initially defined value, that is "0", this circuit configuration shown in FIG. 5 is highly applicable and reduces the circuit area and simplifies the control of the cache system, because of the elimination of the reset signal S/R.

Figure 4:
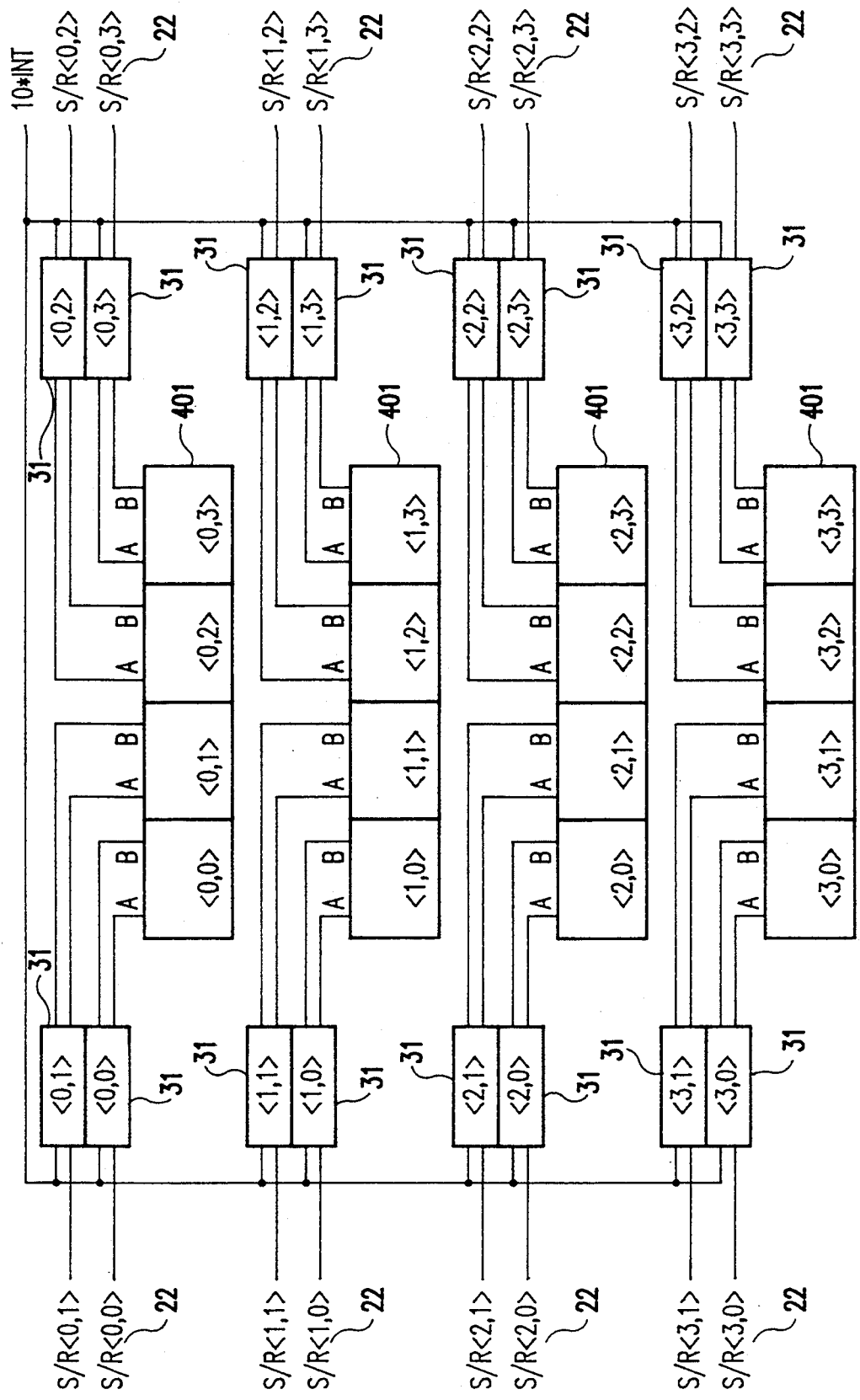
FIG. 4 is a block diagram of a device of fourth embodiment of the invention.

The circuit configuration of memory cells shown in FIG. 5 is also applicable to the third and fourth embodiment explained above so as to eliminate the reset signals S/R in FIG. 3 and 4.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is, therefore, contemplated that the appended claims will cover any modifications or embodiments as fall within the true scope of the present invention.

What is claimed is:

1. A static random access memory device comprising:
   a word decoder operatively coupled to and for driving one of a plurality of word lines;
   a mode controller operatively coupled to said word decoder for outputting a first mode signal to said word decoder to thereby inhibit said word decoder from driving said word lines during a first time period, and for outputting a second mode signal:
   a column selector operatively coupled to said mode controller for selecting one of a plurality of bit lines;
   a plurality of memory cells each respectively disposed at a respective intersection of said plurality of word lines and said plurality of bit lines, each of said memory cells including a flip-flop circuit, each said flip-flop circuit including a first and a second data holding node, and a transfer gate coupled between one of said bit lines and said first data holding node and selectively rendered conductive in response to an active level of one of said word lines; and
   a logic device operatively coupled to said flip-flop circuit responding to said second mode signal to supply a first voltage to said first data holding node and a second voltage different from said first voltage to said second data holding node.

2. A device according to claim 1, further comprising a data controller for outputting a data control signal to said logic device, said logic device responsive to said data control signal for selectively adjusting said first voltage higher than said second voltage or for adjusting said first voltage lower than said second voltage according to a logical value of said data control signal.

3. A device according to claim 2, wherein said logic device corresponds to one of said bit lines and is provided in common for said memory cells associated with said one of said bit lines, said mode controller supplying said second mode signal in common to each said logic device, and said data controller supplying each data control signal to each said logic device independently.

4. A device according to claim 2, wherein said logic device corresponds to one of said word lines and is provided in common for said memory cells associated with said one of said word lines, said mode controller supplying said second mode signal in common to each said logic device, and said data controller supplying each data control signal to said each said logic device independently.

5. A device according to claim 2, wherein said plurality of memory cells are divided into blocks, said memory cells in each of said blocks being commonly coupled to said logic device, each said logic device associated with each of said blocks being operatively coupled to said mode controller and commonly supplied with said second mode signal, and operatively coupled to said data controller and supplied with each data control signal independently.

6. A device according to claim 5, wherein each of said blocks includes a plurality of said word lines and a plurality of said bit lines to form a matrix.

7. A device according to claim 1, wherein said first data holding node is operatively coupled to a constant voltage source,
   said device further comprising a buffer circuit operatively coupled to said second data holding node and an input terminal to which said second mode signal is supplied from said mode controller.

8. A device according to claim 1, wherein said logic device comprises an OR gate.

9. A static memory device comprising:
   a memory cell having a first and a second transistor, gate electrodes of said first and second transistors being connected to drain electrodes of said second and first transistors, respectively;
   a first and a second bit line coupled to each of said drain electrodes of said first and second transistors via a first and a second transfer gate, respectively;
   a word decoder operatively coupled to said first and second transfer gates responsive to a first mode signal for selectively driving the control electrodes of said first and second transfer gates to make an electrical connection between first or second drain electrodes of said drain electrodes and said first or second bit line;
   a logic device operatively coupled to said first and second transistors responsive to a second mode signal for supplying a high and a low voltage to said drain electrodes of said first and second transistors, respectively, thereby setting an initialized data in said memory cell; and
   a mode controller operatively coupled to said word decoder for outputting said first and second mode signal alternately.

10. A device according to claim 9, wherein said logic device comprises an OR gate.

* * * * *